(12) United States Patent
Henri et al.

(10) Patent No.: US 9,589,790 B2
(45) Date of Patent: Mar. 7, 2017

(54) METHOD OF DEPOSITING AMMONIA FREE AND CHLORINE FREE CONFORMAL SILICON NITRIDE FILM

(71) Applicant: Lam Research Corporation, Fremont, CA (US)

(72) Inventors: Jon Henri, West Linn, OR (US); Dennis M. Hausmann, Lake Oswego, OR (US); Shane Tang, West Linn, OR (US); James S. Sims, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/552,245

(22) Filed: Nov. 24, 2014

(65) Prior Publication Data
US 2016/0148806 A1 May 26, 2016

(51) Int. Cl.
*H01L 21/02* (2006.01)
*C23C 16/34* (2006.01)
(Continued)

(52) U.S. Cl.
CPC ........ *H01L 21/0217* (2013.01); *C23C 16/345* (2013.01); *C23C 16/45536* (2013.01);
(Continued)

(58) Field of Classification Search
CPC . C23C 16/345; C23C 16/45542; C23C 16/34; C23C 16/45536; C23C 16/4554; C23C 16/401; C23C 16/45553; H01L 21/28562; H01L 21/02274; H01L 21/28556; H01L 21/76846; H01L 21/0228;
(Continued)

(56) References Cited

U.S. PATENT DOCUMENTS 4,158,717 A 6/1979 Nelson
4,500,563 A 2/1985 Ellenberger et al.
(Continued)

FOREIGN PATENT DOCUMENTS

CN 1732288 A 2/2006
CN 101255548 A 9/2008
(Continued)

OTHER PUBLICATIONS

U.S. Appl. No. 14/935,317, filed Nov. 6, 2015, entitled "Method for Encapsulating a Chalcogenide Material."
(Continued)

*Primary Examiner* — Caleen Sullivan
(74) *Attorney, Agent, or Firm* — Weaver Austin Villeneuve & Sampson LLP

(57) ABSTRACT

Provided herein are methods of depositing conformal silicon nitride films using atomic layer deposition by exposure to a halogen-free, N—H-bond-free, and carbon-free silicon-containing precursor such as disilane, purging of the precursor, exposure to a nitrogen plasma, and purging of the plasma at low temperatures. A high frequency plasma is used, such as a plasma having a frequency of at least 13.56 MHz or at least 27 MHz. Methods yield substantially pure conformal silicon nitride films suitable for deposition in semiconductor devices, such as in trenches or features, or for memory encapsulation.

21 Claims, 5 Drawing Sheets

(51) Int. Cl.
*C23C 16/455* (2006.01)
*C23C 16/30* (2006.01)
*C23C 16/40* (2006.01)

(52) U.S. Cl.
CPC .... *C23C 16/45542* (2013.01); *H01L 21/0228* (2013.01); *H01L 21/02274* (2013.01); *C23C 16/303* (2013.01); *C23C 16/401* (2013.01)

(58) Field of Classification Search
CPC ........... H01L 21/0217; H01L 21/02271; H01L 21/67207; H01L 21/3185; H01L 21/02219; H01L 21/0234; H01L 21/3145; H01L 21/02208; H01L 21/02329; H01L 21/28202; H01L 21/3141
USPC ................................. 438/793, 792, 775, 703
See application file for complete search history.

(56) References Cited

U.S. PATENT DOCUMENTS

| | | | |
|---|---|---|---|
| 4,575,921 A | 3/1986 | Bhagat | |
| 4,869,781 A | 9/1989 | Euen et al. | |
| 5,091,332 A | 2/1992 | Bohr et al. | |
| 5,230,929 A * | 7/1993 | Caporiccio | B05D 1/62 427/316 |
| 5,496,608 A | 3/1996 | Matsuda et al. | |
| 5,670,432 A | 9/1997 | Tsai | |
| 5,731,235 A | 3/1998 | Srinivasan et al. | |
| 5,856,003 A | 1/1999 | Chiu | |
| 6,153,519 A | 11/2000 | Jain et al. | |
| 6,197,701 B1 | 3/2001 | Shue et al. | |
| 6,228,779 B1 | 5/2001 | Bloom et al. | |
| 6,380,056 B1 | 4/2002 | Shue et al. | |
| 6,395,652 B2 | 5/2002 | Kim et al. | |
| 6,416,822 B1 | 7/2002 | Chiang et al. | |
| 6,428,859 B1 | 8/2002 | Chiang et al. | |
| 6,518,167 B1 | 2/2003 | You et al. | |
| 6,534,395 B2 | 3/2003 | Werkhoven et al. | |
| 6,548,368 B1 | 4/2003 | Narwankar et al. | |
| 6,632,478 B2 | 10/2003 | Gaillard et al. | |
| 6,638,879 B2 | 10/2003 | Hsieh et al. | |
| 6,645,574 B1 | 11/2003 | Lee et al. | |
| 6,709,928 B1 | 3/2004 | Jenne et al. | |
| 6,730,614 B1 | 5/2004 | Lim et al. | |
| 6,794,284 B2 | 9/2004 | Vaartstra | |
| 6,933,245 B2 | 8/2005 | Lee et al. | |
| 6,967,159 B2 | 11/2005 | Vaartstra | |
| 7,019,159 B2 | 3/2006 | Dussarrat et al. | |
| 7,041,335 B2 | 5/2006 | Chung | |
| 7,172,792 B2 | 2/2007 | Wang et al. | |
| 7,297,641 B2 | 11/2007 | Todd et al. | |
| 7,300,885 B2 | 11/2007 | Hasebe et al. | |
| 7,351,668 B2 | 4/2008 | Chou et al. | |
| 7,462,571 B2 | 12/2008 | Hasebe et al. | |
| 7,465,669 B2 | 12/2008 | Iyer et al. | |
| 7,507,676 B2 | 3/2009 | Chou et al. | |
| 7,510,984 B2 | 3/2009 | Saito et al. | |
| 7,514,366 B2 | 4/2009 | Trivedi et al. | |
| 7,622,369 B1 | 11/2009 | Lee et al. | |
| 7,629,267 B2 | 12/2009 | Wan et al. | |
| 7,651,730 B2 | 1/2010 | Hasebe | |
| 7,651,953 B2 | 1/2010 | Todd et al. | |
| 7,651,959 B2 | 1/2010 | Fukazawa et al. | |
| 7,682,657 B2 | 3/2010 | Sherman | |
| 7,713,592 B2 | 5/2010 | Nguyen et al. | |
| 7,758,920 B2 | 7/2010 | Hasebe et al. | |
| 7,825,039 B2 | 11/2010 | Takahashi et al. | |
| 7,919,416 B2 | 4/2011 | Lee et al. | |
| 7,939,455 B2 | 5/2011 | Clark | |
| 7,964,241 B2 | 6/2011 | Hasebe et al. | |
| 7,964,513 B2 | 6/2011 | Todd et al. | |
| 7,989,365 B2 | 8/2011 | Park et al. | |
| 8,034,673 B2 | 10/2011 | Kadonaga et al. | |
| 8,080,290 B2 | 12/2011 | Hasebe et al. | |
| 8,119,544 B2 | 2/2012 | Hasebe et al. | |
| 8,178,448 B2 | 5/2012 | Nodera et al. | |
| 8,227,032 B2 | 7/2012 | Dussarrat et al. | |
| 8,257,789 B2 | 9/2012 | Matsunaga et al. | |
| 8,298,628 B2 | 10/2012 | Yang et al. | |
| 8,366,953 B2 | 2/2013 | Kohno et al. | |
| 8,383,525 B2 | 2/2013 | Raisanen et al. | |
| 8,394,466 B2 | 3/2013 | Hong et al. | |
| 8,592,328 B2 | 11/2013 | Hausmann et al. | |
| 8,669,185 B2 | 3/2014 | Onizawa et al. | |
| 8,728,956 B2 | 5/2014 | LaVoie et al. | |
| 8,753,984 B2 | 6/2014 | Murakami et al. | |
| 8,791,034 B2 | 7/2014 | Shealy et al. | |
| 9,023,737 B2 | 5/2015 | Beynet et al. | |
| 9,070,555 B2 | 6/2015 | Hausmann et al. | |
| 9,214,333 B1 | 12/2015 | Sims et al. | |
| 2003/0143841 A1 | 7/2003 | Yang et al. | |
| 2004/0043570 A1 | 3/2004 | Fujisaki et al. | |
| 2005/0025885 A1 | 2/2005 | McSwiney et al. | |
| 2005/0042865 A1 | 2/2005 | Cabral et al. | |
| 2005/0100670 A1 * | 5/2005 | Dussarrat | C23C 16/308 427/255.393 |
| 2005/0109276 A1 | 5/2005 | Iyer et al. | |
| 2005/0118837 A1 | 6/2005 | Todd et al. | |
| 2005/0159017 A1 | 7/2005 | Kim et al. | |
| 2005/0196977 A1 | 9/2005 | Saito et al. | |
| 2005/0227017 A1 | 10/2005 | Senzaki et al. | |
| 2005/0287309 A1 | 12/2005 | Veerasamy | |
| 2005/0287775 A1 | 12/2005 | Hasebe et al. | |
| 2006/0008656 A1 | 1/2006 | Veerasamy | |
| 2006/0084283 A1 | 4/2006 | Paranjpe et al. | |
| 2006/0088985 A1 * | 4/2006 | Haverkort | C23C 16/24 438/479 |
| 2006/0199357 A1 | 9/2006 | Wan et al. | |
| 2006/0286776 A1 | 12/2006 | Ranish et al. | |
| 2007/0137572 A1 | 6/2007 | Matsuura et al. | |
| 2007/0167028 A1 | 7/2007 | Chou et al. | |
| 2007/0251444 A1 | 11/2007 | Gros et al. | |
| 2008/0038936 A1 | 2/2008 | Todd et al. | |
| 2008/0063791 A1 | 3/2008 | Hasebe et al. | |
| 2008/0081470 A1 | 4/2008 | Clark | |
| 2008/0119057 A1 | 5/2008 | Chua et al. | |
| 2008/0124946 A1 | 5/2008 | Xiao et al. | |
| 2008/0138996 A1 | 6/2008 | Nishizuka | |
| 2008/0139003 A1 | 6/2008 | Pirzada et al. | |
| 2008/0213479 A1 | 9/2008 | Chou et al. | |
| 2008/0274302 A1 | 11/2008 | Hasebe et al. | |
| 2008/0311760 A1 | 12/2008 | Nodera et al. | |
| 2008/0318443 A1 | 12/2008 | Kim et al. | |
| 2009/0018668 A1 | 1/2009 | Galbraith | |
| 2009/0075490 A1 | 3/2009 | Dussarrat | |
| 2009/0148625 A1 | 6/2009 | Yeom et al. | |
| 2009/0155606 A1 | 6/2009 | Yoon et al. | |
| 2009/0191722 A1 | 7/2009 | Hasebe et al. | |
| 2010/0124621 A1 | 5/2010 | Kobayashi et al. | |
| 2010/0136260 A1 | 6/2010 | Matsunaga et al. | |
| 2010/0136313 A1 | 6/2010 | Shimizu et al. | |
| 2010/0151681 A1 | 6/2010 | Knapp et al. | |
| 2010/0221925 A1 | 9/2010 | Lee et al. | |
| 2010/0304047 A1 * | 12/2010 | Yang | C23C 16/308 427/577 |
| 2010/0304574 A1 | 12/2010 | Nodera et al. | |
| 2010/0310791 A1 | 12/2010 | Shimazu et al. | |
| 2011/0003477 A1 | 1/2011 | Park et al. | |
| 2011/0014795 A1 | 1/2011 | Lee et al. | |
| 2011/0086516 A1 | 4/2011 | Lee et al. | |
| 2011/0151142 A1 | 6/2011 | Seamons et al. | |
| 2011/0256734 A1 | 10/2011 | Hausmann et al. | |
| 2012/0009803 A1 | 1/2012 | Jung et al. | |
| 2012/0028469 A1 | 2/2012 | Onizawa et al. | |
| 2012/0058282 A1 | 3/2012 | Hong et al. | |
| 2012/0104347 A1 | 5/2012 | Quick | |
| 2012/0108079 A1 | 5/2012 | Mahajani | |
| 2012/0164846 A1 | 6/2012 | Ha et al. | |
| 2012/0177841 A1 | 7/2012 | Thompson | |
| 2012/0213940 A1 | 8/2012 | Mallick | |
| 2012/0282418 A1 | 11/2012 | Chou et al. | |
| 2012/0315394 A1 | 12/2012 | Ito | |
| 2013/0071580 A1 | 3/2013 | Weidman et al. | |

(56) References Cited

U.S. PATENT DOCUMENTS

| | | |
|---|---|---|
| 2013/0115783 A1 | 5/2013 | Kim et al. |
| 2013/0189854 A1 | 7/2013 | Hausmann et al. |
| 2013/0252437 A1 | 9/2013 | Sano et al. |
| 2013/0344248 A1 | 12/2013 | Clark |
| 2014/0141626 A1 | 5/2014 | Hausmann et al. |
| 2014/0193983 A1 | 7/2014 | LaVoie |
| 2014/0273477 A1 | 9/2014 | Niskanen et al. |
| 2014/0273528 A1* | 9/2014 | Niskanen ............ H01L 21/0234 438/792 |
| 2014/0302686 A1 | 10/2014 | Pan et al. |
| 2015/0031218 A1 | 1/2015 | Karakawa |
| 2015/0243708 A1 | 8/2015 | Ravasio et al. |
| 2015/0259791 A1 | 9/2015 | Hausmann et al. |
| 2016/0046501 A1 | 2/2016 | Kverel et al. |
| 2016/0093484 A1 | 3/2016 | Marsh |
| 2016/0148800 A1 | 5/2016 | Henri et al. |

FOREIGN PATENT DOCUMENTS

| | | |
|---|---|---|
| CN | 101378007 A | 3/2009 |
| EP | 0 277 766 | 8/1988 |
| JP | 2010-10497 | 1/2010 |
| JP | 2013225655 A | 10/2013 |
| KR | 10-2009-0080019 | 7/2009 |
| WO | WO 2006/026350 | 3/2006 |
| WO | WO 2011/130397 | 10/2011 |

OTHER PUBLICATIONS

"PlasmaPro™ NGP®80 Range," *Oxford Instruments* (2010), 8 pages.

U.S. Appl. No. 14/552,011, filed Nov. 24, 2014, entitled "Selective Inhibition in Atomic Layer Deposition of Silicon-Containing Films."

U.S. Appl. No. 14/678,736, filed Apr. 3, 2015, entitled "Deposition of Conformal Films by Atomic Layer Deposition and Atomic Layer Etch."

U.S. Appl. No. 14/935,317, filed Nov. 6, 2015, entitled "Method for Encapsulating a Chalcogenide Material."

US Notice of Allowance dated Aug. 18, 2015 issued in U.S. Appl. No. 14/494,914.

US Office Action dated Sep. 14, 2012 issued in U.S. Appl. No. 13/084,305.

US Final Office Action dated Apr. 25, 2013 issued in U.S. Appl. No. 13/084,305.

US Office Action dated Jun. 7, 2013 issued U.S. Appl. No. 13/414,619.

US Notice of Allowance dated Jul. 26, 2013, issued U.S. Appl. No. 13/414,619.

US Office Action dated Apr. 11, 2014 issued in U.S. Appl. No. 14/065,334.

US Final Office Action dated Nov. 14, 2014 issued in U.S. Appl. No. 14/065,334.

US Notice of Allowance dated Feb. 17, 2015 issued in U.S. Appl. No. 14/065,334.

PCT Invitation to Pay Additional Fees; Communication Re Partial International Search, dated Dec. 16, 2011, issued in PCT/US2011/032303.

PCT International Search Report and Written Opinion, dated Feb. 20, 2012, issued in PCT/US2011/032303.

PCT International Preliminary Report on Patentability and Written Opinion, dated Oct. 26, 2012, issued in PCT/US2011/032303.

European Extended Search Report dated Apr. 14, 2014 issued in EP 13 15 2046.

Korean Notice of Provisional Rejection dated Dec. 6, 2013 issued in KR 10-2012-0043797.

Korean Final Office Action dated Aug. 18, 2014 issued in KR 10-2012-0043797.

Korean Decision from the Patent Tribunal of the KIPO [description] dated May 26, 2015 issued in KR 10-2012-0043797.

Cecchi et al., (2007) "Ultra-thin conformal pore-sealing of low-k materials by plasma-assisted ALD," University of New Mexico, Albuquerque, NM, Sandia National Labs, Albuquerque, NM, 1 page.

King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).

Lin et al., (1998) "Silicon Nitride Films Deposited by Atmospheric Pressure Chemical Vapor Deposition," *Materials Research Society Symposium Proceedings vol. 495, Chemical Aspects of Electronic Ceramics Processing*, Symposium held Nov. 30-Dec. 4, 1997, Boston, Massachusetts, U.S.A., 8 pages.

Plasma Enhanced Atomic Layer Deposition (PEALD), Website: http://www.asm.com/index.php?option=com_content&task=view&id=19&Itemid=161 (2010), 1 page.

"PlasmaPro™ NGP® 80 Range," *Oxford Instruments* (2010), 8 pages.

U.S. Appl. No. 15/272,222, filed Sep. 21, 2016, entitled "Bromine Containing Silicon Precursors for Encapsulation Layers."

U.S. Appl. No. 15/201,221, filed Jul. 1, 2016, entitled "Selective Atomic Layer Deposition With Post-Dose Treatment."

U.S. Appl. No. 15/253,301, filed Aug. 31, 2016, entitled "Selective Atomic Layer Deposition for Gapfill Using Sacrificial Underlayer."

U.S. Appl. No. 15/253,546, filed Aug. 31, 2016, entitled "High Dry Etch Rate Materials for Semiconductor Patterning Applications."

US Office Action dated May 25, 2016 issued in U.S. Appl. No. 14/552,011.

US Notice of Allowance dated Sep. 26, 2016 issued in U.S. Appl. No. 14/552,011.

US Notice of Allowance dated Jul. 15, 2016 issued in U.S. Appl. No. 14/678,736.

US Office Action dated Apr. 18, 2016 issued in U.S. Appl. No. 14/935,317.

Chinese First Office Action dated May 19, 2016 issued in CN 201310021460.8.

Aboaf, J.A. (1969) "Some Properties of Vapor Deposited Silicon Nitride Films Obtained by the Reaction of SiBr4 and NH 3," *Journal of the Electrochemical Society*, 116(12):1736-1740.

* cited by examiner

METHOD OF DEPOSITING AMMONIA FREE AND CHLORINE FREE CONFORMAL SILICON NITRIDE FILM

BACKGROUND

Silicon nitride (SiN) thin films have unique physical, chemical and mechanical properties and thus are used in a variety of applications, particularly semiconductor devices, for example in diffusion barriers, gate insulators, sidewall spacers, encapsulation layers, strained films in transistors, and the like. Conventional SiN films have been deposited at relatively high temperatures, such as in Front End of Line (FEOL) applications. For example, SiN films are typically deposited by chemical vapor deposition (CVD) in a reactor at temperatures greater than 750° C. using dichlorosilane and ammonia. However, as SiN films are used in late-stage semiconductor fabrication processes, and as device dimensions continue to shrink, there is an increasing demand for SiN films to be formed at lower temperatures, for example less than 600° C.

SUMMARY

Provided herein are methods of depositing silicon nitride films. One aspect includes a method of depositing a silicon nitride film on a substrate in a chamber by (a) exposing the substrate to a silicon-containing precursor under conditions allowing formation of an adsorbed layer of the silicon containing precursor on the substrate surface, and (b) exposing the adsorbed layer to a nitrogen ($N_2$) plasma to thereby form a silicon nitride film, where the silicon-containing precursor is N—H bond-free. In some embodiments, the silicon-containing precursor is halide-free. In some embodiments, the silicon-containing precursor is carbon-free. In various embodiments, a carrier gas is flowed throughout (a) through (b). In some embodiments, the carrier gas is hydrogen-free.

In some embodiments, the silicon-containing precursor is selected from the group consisting of silane, disilane, trisilane, tetrasilane, and trisilylamine. In some embodiments, the silicon-containing precursor has a silicon to hydrogen ratio between about 12:4 and about 12:5. In various embodiments, the process temperature is less than about 250° C.

The method may also include (c) repeating (a)-(b), and (d) periodically exposing the substrate to a hydrogen-containing plasma. The substrate may be exposed to the hydrogen-containing plasma for a time between about 0.05 seconds and about 60 seconds.

In some embodiments, exposing the substrate to the hydrogen-containing plasma includes exposing the substrate to a hydrogen-containing gas and igniting a plasma, where the hydrogen-containing gas is selected from the group consisting of ammonia, hydrogen, and combinations thereof.

In various embodiments, the frequency of the plasma is at least about 13.56 MHz. In some embodiments, the frequency of the plasma is about 27 MHz.

In some embodiments, the silicon containing precursor is adsorbed onto less than about 60% of the substrate surface. The adsorbed layer on the substrate surface in (a) may be less than about 0.5 Å thick.

Another aspect includes a method of depositing a silicon nitride film on a substrate in a chamber by (a) exposing the substrate to a silicon-containing precursor under conditions allowing formation of an adsorbed layer of the silicon containing precursor on the substrate surface, and (b) exposing the adsorbed layer to a nitrogen ($N_2$) plasma to thereby form a silicon nitride film, where the silicon-containing precursor comprises at least about 75% nonpolar covalent bonds. In some embodiments, the silicon-containing precursor is trisilylamine.

The method may also include (c) repeating (a)-(b), and (d) periodically exposing the substrate to a hydrogen-containing plasma. The substrate may be exposed to the hydrogen-containing plasma for a time between about 0.05 seconds and about 60 seconds.

In some embodiments, exposing the substrate to the hydrogen-containing plasma includes exposing the substrate to a hydrogen-containing gas and igniting a plasma, where the hydrogen-containing gas is selected from the group consisting of ammonia, hydrogen, and combinations thereof. In various embodiments, the adsorbed layer on the substrate surface in (a) is less than about 0.5 Å thick.

These and other aspects are described further below with reference to the drawings.

DETAILED DESCRIPTION

Figure 1:
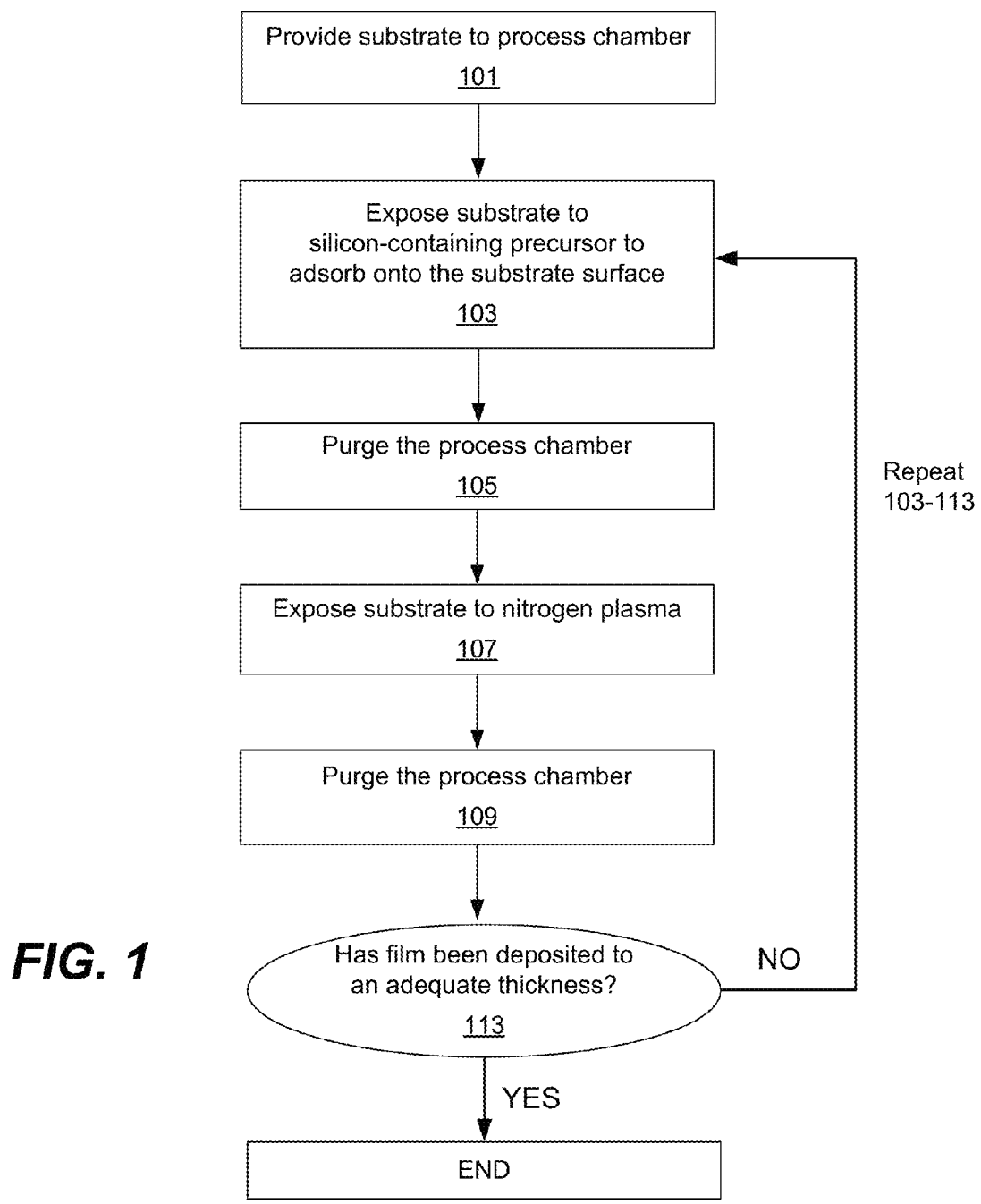
FIG. 1 is a process flow diagram depicting operations for a method in accordance with disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Silicon nitride may be used in semiconductor device fabrication as diffusion barriers, gate insulators, sidewall spacers, and encapsulation layers. In particular, in some semiconductor devices, a carbon layer may be deposited on a phase change layer that is modified when heated. When heated, a damaged phase change layer may not change phases. This phase change layer may also be sensitive to light. To prevent any damage to the phase change layer, a conformal memory encapsulation layer, which may be silicon nitride, is deposited on the phase change layer. The memory encapsulation has little to no contamination of other compounds and is deposited at low temperatures to avoid damaging the device. Conformal silicon nitride layers may also be used in other applications.

Provided herein are methods of depositing conformal silicon nitride by atomic layer deposition (ALD) using high molecular weight, halogen-free, carbon-free silicon-containing precursors, and nitrogen plasma. In some embodiments, the precursors are also free of N—H bonds. The term "nitrogen plasma" as used herein should be understood to mean plasma generated by igniting nitrogen ($N_2$) gas with a remote or in-situ plasma generator. The deposited silicon nitride films have little to no carbon contamination, and no halogen contamination.

The deposited films may be highly conformal. Conformality of films may be measured by the step coverage. Step coverage may be calculated by comparing the average thickness of a deposited film on a bottom, sidewall, or top of a feature to the average thickness of a deposited film on a bottom, sidewall, or top of a feature. For example, step coverage may be calculated by dividing the average thickness of the deposited film on the sidewall by the average thickness of the deposited film at the top of the feature and multiplying it by 100 to obtain a percentage.

The methods provided herein involve deposition by ALD. Unlike a chemical vapor deposition (CVD) technique, ALD processes use surface-mediated deposition reactions to deposit films on a layer-by-layer basis. In one example of an ALD process, a substrate surface, including a population of surface active sites, is exposed to a gas phase distribution of a first precursor, such as a silicon-containing precursor, in a dose provided to a process station housing the substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. In certain embodiments, an ALD precursor dose partially saturates the substrate surface. In some embodiments, the dose phase of an ALD cycle concludes before precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587, filed Oct. 23, 2013, titled "SUB-SATURATED ATOMIC LAYER DEPOSITION AND CONFORMAL FILM DEPOSITION," which is incorporated herein by reference in its entirety. After a first precursor dose, the reactor is then evacuated to remove any first precursor remaining in gas phase so that only the adsorbed species remain. A second reactant, such as a nitrogen-containing reactant, is introduced to the reactor so that some of these molecules react with the first precursor adsorbed on the surface. In some processes, the second precursor reacts immediately with the adsorbed first precursor. In other embodiments, the second precursor reacts only after a source of activation is applied temporally. The reactor may then be evacuated again to remove unbound second precursor molecules. Additional ALD cycles may be used to build film thickness.

In some implementations, the ALD methods include plasma activation. As described herein, the ALD method and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in its entireties.

Disclosed embodiments include methods that form an adsorbed layer of the silicon precursor that is sufficiently reactive to react with nitrogen plasma at low temperatures. Methods include atomic layer deposition (ALD) processes in which a silicon precursor is adsorbed onto a substrate surface. In many embodiments, the methods disclosed may be performed at a temperature less than about 250° C., such as about 200° C. In some embodiments, the pedestal is set to a temperature of less than about 250° C. In some embodiments, the method is performed at a higher temperature, such as greater than about 250° C., or greater than 300° C. In general, a higher deposition temperature results in higher step coverage, but temperature may be limited by the device to avoid damaging any existing layers on the device. In various embodiments, the methods may be performed at a pressure between about 0.1 Torr and about 20 Torr. In the following example, flow rates are provided for a 180 L chamber, which may include a number of process stations. In some cases, depending on the reactor configuration, the flow rates may be scaled to accommodate different volumes. Embodiments described herein may also operate at higher frequency plasmas, which help form a silicon nitride film with a lower wet etch rate. In many embodiments, silicon nitride films are deposited in ALD cycles as described herein.

Figure 2:
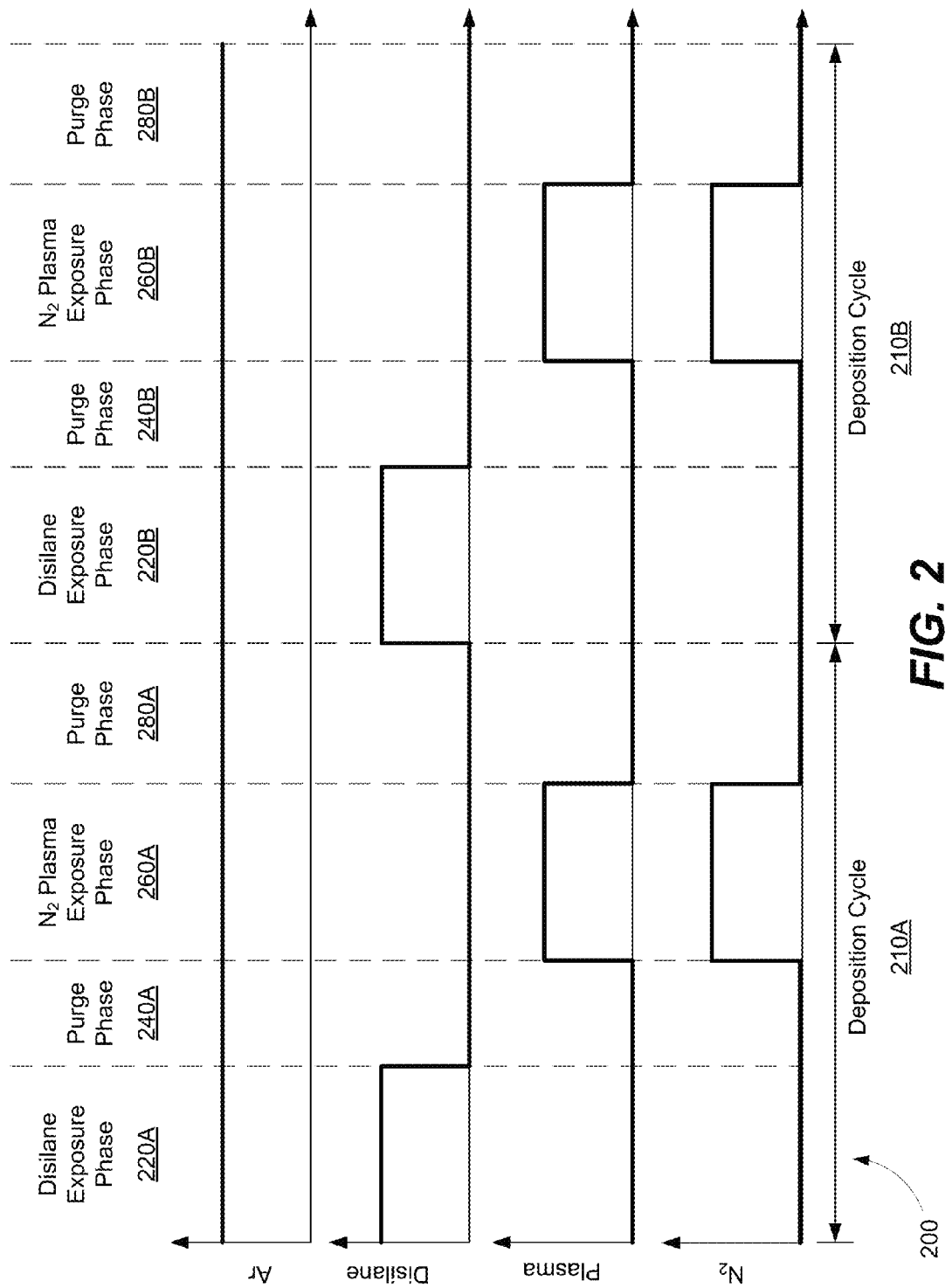
FIG. 2 is a timing sequence diagram showing an example of cycles in a method in accordance with disclosed embodiments.

FIG. 1 is an example of a process flow diagram depicting operations for performing methods in accordance with disclosed embodiments. FIG. 2 is a timing sequence diagram of example pulses in accordance with disclosed embodiments. FIG. 2 shows phases in an example ALD process 200, for various process parameters, such as carrier gas flow, silicon-precursor flow, plasma, and nitrogen flow. In FIG. 2, argon is indicated as an example carrier gas and disilane represents an example of a silicon-precursor. The lines indicate when the flow or plasma is turned on and off, accordingly. Example process parameters include, but are not limited to, flow rates for inert and reactant species, plasma power and frequency, substrate temperature, and process station pressure. FIGS. 1 and 2 will be described together below.

In operation 101 of FIG. 1, a substrate is provided to a process station. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Substrates may have "features" such as via or contact holes, which may be characterized by one or more of narrow and/or re-entrant openings, constrictions within the feature, and high aspect ratios. The feature may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some embodiments, the feature may have an aspect ratio of at least about 2:1, at least about 4:1, at least about 6:1, at least about 10:1, or higher. The feature may also have a dimension near the opening, e.g., an opening diameter or line width of between about 10 nm to 500 nm, for example between about 25 nm and about 300 nm. Disclosed methods may be performed on substrates with features having an opening less than about 150 nm. A feature via or trench may be referred to as an unfilled feature or a feature. A feature that may have a re-entrant profile that narrows from the bottom, closed end, or interior of the feature to the feature opening.

During operations 103-109 of FIG. 1, an inert gas may be flowed. In various embodiments, the inert gas is used as a carrier gas. Example carrier gases include argon (Ar), helium (He), and neon (Ne). In some embodiments, the carrier gas is not hydrogen, such that little to no hydrogen is incorporated into the deposited silicon nitride film. In some embodiments, a hydrogen-containing carrier gas may be used. The example sequence in FIG. 2 uses argon as an example carrier gas, which is continuously flowed during the entire process. The inert gas may be provided to assist with pressure and/or temperature control of the process chamber, evaporation of a liquid reactant, more rapid delivery of the reactant and/or as a sweep gas for removing process gases from the process chamber and/or process chamber plumbing. In some embodiments, nitrogen may be flowed throughout operations 103-109, and ignited as a nitrogen plasma in operation 107 as described below.

In operation 103 of FIG. 1, the substrate is exposed to a silicon-containing precursor that is adsorbed onto the substrate surface. This operation may be part of an ALD cycle. The concept of an ALD "cycle" is relevant to the discussion of various embodiments herein. Generally a cycle is the minimum set of operations used to perform a surface deposition reaction one time. The result of one cycle is production of at least a partial silicon nitride film layer on a substrate surface. Typically, an ALD cycle includes operations to deliver and adsorb at least one reactant to the substrate surface, and then react the adsorbed reactant with one or more reactants to form the partial layer of film. The cycle may include certain ancillary operations such as sweeping one of the reactants or byproducts and/or treating the partial film as deposited. Generally, a cycle contains one instance of a unique sequence of operations. As an example, a cycle may include the following operations: (i) delivery/adsorption of a silicon-containing precursor, (ii) purging of silicon-containing precursor from the station, (iii) delivery of nitrogen plasma, and (iv) purging of plasma from the station.

Any suitable number of deposition cycles may be included in an ALD process to deposit a desired film thickness of silicon nitride. The timing sequence in FIG. 2 depicts various operations of FIG. 1 in two deposition cycles, 210A and 210B. As shown, in each cycle, the substrate is exposed to disilane as described above with respect to operation 103 of FIG. 1. For example, during deposition cycle 210A, the substrate is exposed to disilane during the disilane exposure phase 220A, and during deposition cycle 210B, the substrate is exposed to disilane during the disilane exposure phase 220B. Note that during the disilane exposure phases 220A and 220B, the plasma is turned off, no nitrogen is flowed to the station, and the carrier gas, such as argon, continues to flow. The substrate may be exposed to the silicon-containing precursor for a time between about 0.2 seconds and about 6 seconds, depending on the flow rate and the substrate surface area.

Returning to FIG. 1, during operation 103, the substrate is exposed to the silicon-containing precursor such that the silicon-containing precursor is adsorbed onto the substrate surface to form an adsorbed layer. In some embodiments, the silicon-containing precursor adsorbs onto the substrate surface in a self-limiting manner such that once active sites are occupied by the silicon-containing precursor, little or no additional silicon-containing precursor will be adsorbed on the substrate surface. For example, silicon-containing precursors may be adsorbed onto about 60% of the substrate surface. In various embodiments, when the silicon-containing precursor is flowed to the station, the silicon-containing precursor adsorbs onto active sites on the surface of the substrate, forming a thin layer of the silicon-containing precursor on the surface. In various embodiments, this layer may be less than a monolayer, and may have a thickness between about 0.2 Å and about 0.4 Å. Methods provided herein may be performed at a temperature less than about 450° C. At process temperatures greater than about 450° C., some silicon-containing precursors may decompose to form a layer of silicon.

Unlike a CVD or CVD-like process, the silicon-containing precursor does not decompose to form a silicon layer. In various embodiments, operation 103 is performed such that not all active sites are occupied by a silicon-containing precursor.

In some embodiments, the silicon-containing precursor does not include any N—H bonds, and does not include a primary or secondary amine. In some embodiments, the silicon-containing precursor has no $NH_3$ groups. In various embodiments, the silicon-containing precursor is halogen-free. In some embodiments, the silicon-containing precursor is carbon-free. In some embodiments, the silicon-precursor is free of N—H bonds. The silicon-containing precursor may also have a hydrogen to silicon atomic ratio of between about 12:3 to about 12:5.

Generally, silicon-containing precursors as used in methods described herein do not have an electron-donating or electron-attracting group. Without being bound by a particular theory, silicon-containing precursors that do not have electron-donating or electron-attracting groups may be more reactive to form silicon-nitrogen bonds. In some embodiments, the silicon-containing precursor does not include highly polar bonds. The adsorbed surface layer of the substrate may include nonpolar covalent bonds extending from the substrate surface to react with the plasma. In various embodiments, the silicon-containing precursor includes more than about 75% nonpolar covalent bonds. For example, trisilylamine includes 3 polar covalent Si—N bonds and 9 nonpolar covalent Si—H bonds. In some embodiments, the electronegativity difference between the two atoms at the bonds at the ends of the silicon-containing precursor is less than 0.5 on the Pauling scale.

Example silicon-containing precursors suitable for use in accordance with disclosed embodiments include polysilanes $(H_3Si—(SiH_2)_n—SiH_3)$, where n≥1, such as silane, disilane, trisilane, tetrasilane; and trisilylamine:

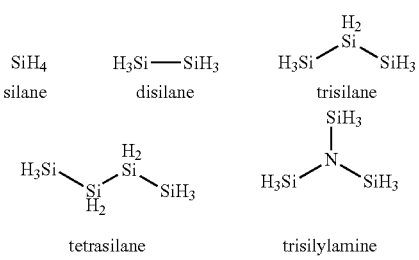

Returning to FIG. 1, in operation 105, the process station is optionally purged to remove excess silicon-containing precursor in gas phase that did not adsorb onto the surface of the substrate. Purging may involve a sweep gas, which may be a carrier gas used in other operations or a different gas. In some embodiments, purging may involve evacuating the chamber. Operation 105 of FIG. 1 may correspond with purge phase 240A or purge phrase 240B of FIG. 2, where the disilane flow is turned off, no plasma is ignited, and no nitrogen is supplied to the station. The carrier gas, such as argon, continues to flow to purge any excess disilane from the station. In some embodiments, purge phase 240A may include one or more evacuation subphases for evacuating the process station. Alternatively, it will be appreciated that purge phase 240A may be omitted in some embodiments. Purge phase 240A may have any suitable duration, such as between about 0 seconds and about 60 seconds, or about 0.01 seconds. In some embodiments, increasing a flow rate of a one or more sweep gases may decrease the duration of purge phase 240A. For example, a purge gas flow rate may be adjusted according to various reactant thermodynamic characteristics and/or geometric characteristics of the process station and/or process station plumbing for modifying the duration of purge phase 240A. In one non-limiting example, the duration of a sweep phase may be adjusted by modulating sweep gas flow rate. This may reduce deposition cycle time, which may improve substrate throughput. After a purge, the silicon-containing precursors remain adsorbed onto the substrate surface.

In some embodiments, the substrate may be optionally periodically exposed to a hydrogen-containing plasma to selectively inhibit deposition near the top of a feature. Such exposure may improve the conformality of the deposited film. Exposure to the hydrogen-containing plasma may last between about 0.05 seconds and about 60 seconds. Methods of using a hydrogen-containing inhibitor to tune conformality in atomic layer deposition are described in U.S. patent application Ser. No. 14/552,011 filed on Nov. 24, 2014 titled "SELECTIVE INHIBITION IN ATOMIC LAYER DEPOSITION OF SILICON-CONTAINING FILMS,", which is herein incorporated by reference in its entirety.

In operation 107 of FIG. 1, the substrate is exposed to a nitrogen plasma. Accordingly, in FIG. 2, nitrogen flow and the plasma are both turned on during the nitrogen plasma exposure phase in 260A and 260B for the deposition cycles 210A and 210B respectively. In some embodiments, nitrogen flow may be turned on prior to turning on the plasma, for example, to allow the nitrogen flow to stabilize. Note that disilane flow is turned off during the plasma exposure phases and argon as a carrier gas continues to flow. The substrate may be exposed to the nitrogen plasma for a duration between about 0.1 second and about 6 seconds. In some embodiments, nitrogen plasma exposure phase 260A or 260B may have a duration that exceeds a time for plasma to interact with all precursors adsorbed on the substrate surface, forming a continuous film atop the substrate surface.

In various embodiments, the plasma is an in-situ plasma, such that the plasma is formed directly above the substrate surface in the station. The in-situ plasma may be ignited at a power per substrate area between about 0.2122 W/cm$^2$ and about 2.122 W/cm$^2$. For example, the power may range from about 600 W to about 6000 W for a chamber processing four 300 mm wafers. For example, plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. Non-limiting examples of electrodes include process gas distribution showerheads and substrate support pedestals. It will be appreciated that plasmas for ALD processes may be formed by one or more suitable methods other than capacitive coupling of an RF field to a gas. In some embodiments, the plasma is a remote plasma, such that nitrogen is ignited in a remote plasma generator upstream of the station, then delivered to the station where the substrate is housed.

During operation 107, plasma energy is provided to activate the nitrogen gas into ions and radicals, which react with the adsorbed layer of silicon-containing precursor. For example, the plasma may directly or indirectly activate the nitrogen gas phase molecules to form nitrogen radicals or ions. Nitrogen radicals, although short-lived, may enter a trench or feature in the substrate to react with the adsorbed layer on the surface of the substrate. However, step coverage may not be 100% in a single cycle since some nitrogen radicals may be deactivated after entering a trench or via. Nonetheless, using a nitrogen plasma reduces contamination in the deposited conformal silicon nitride film.

Without being bound by a particular theory, higher frequency plasmas may generate more radicals than ions, thereby improving deposition of silicon nitride due to higher reactivity between the radicals and the silicon-containing precursor. The radical density desired during this operation therefore depends on the plasma frequency. In various embodiments, a high frequency plasma is used having a frequency of at least about 13.56 MHz, or at least about 27 MHz, or at least about 40 MHz, or at least about 60 MHz. In some embodiments, having a higher ion density reduces conformality of the film, but conformality may be improved using methods described herein.

Once the plasma activates the nitrogen gas, the nitrogen radicals and ions react with the silicon-containing precursor adsorbed on the surface of the substrate, forming silicon-nitrogen bonds and a thin film of silicon nitride. This resulting film is carbon-free and halogen-free due to the lack of carbons in the chemistry used to deposit these films.

Returning to FIG. 1, in operation 109, the process station is purged. As shown in FIG. 2, operation 109 may correspond with purge phase 280A or purge phase 280B, where the disilane flow is turned off, no plasma is ignited, and no nitrogen is supplied to the station. The purge may be performed by flowing the carrier gas, which may be any of those described above with respect to operation 105. In many embodiments, the carrier gas used in operation 105 and 109 are the same gas, and in some embodiments, the carrier gas is continuously flowed during these operations, such as shown in FIG. 2.

Performing operations 103-109 of FIG. 1 may constitute a cycle, such as deposition cycle 210A, or deposition cycle 210B in FIG. 2. Depending on the exposure time of the operations, each cycle may deposit a silicon nitride film having a thickness between about 0.05 Å and about 2 Å. For example, deposition at about 250° C. with disilane as a precursor may deposit about 0.5 Å per cycle. Thus, processes may be time consuming when depositing films more than a few nanometers thick. Further, some reactants may have long exposure times to deposit a conformal film, which may also reduce wafer throughput.

In operation 113, it is determined whether the film has been deposited to an adequate thickness. If not, operations 103-109 may be repeated. In some repeated cycles, exposure to a hydrogen-containing inhibitor may be used in each cycle or in a selected number of cycles to inhibit deposition and improve conformality of the deposited silicon nitride layers. The method depicted in FIGS. 1 and 2 produce conformal silicon nitride films that are carbon-free, since no carbon-containing compounds are used in the process. These compounds are also halogen-free, because the silicon-containing precursors used do not contain halogens. In some embodiments where hydrogen is not used as a carrier gas, there is also less incorporation of hydrogen in the silicon nitride film. Films deposited using the disclosed embodiments are suitable for use in many semiconductor processing applications, such as deposition of memory encapsulation films, due to their low contamination. Silicon nitride films as described herein may also be used as a layer to suppress dilute hydrogen fluoride (HF) wet etch rate and compensate for wet etch rate degradation due to inherent loss of density at the lower temperatures used for emerging memory encapsulation layer applications.

Apparatus

Figure 3:
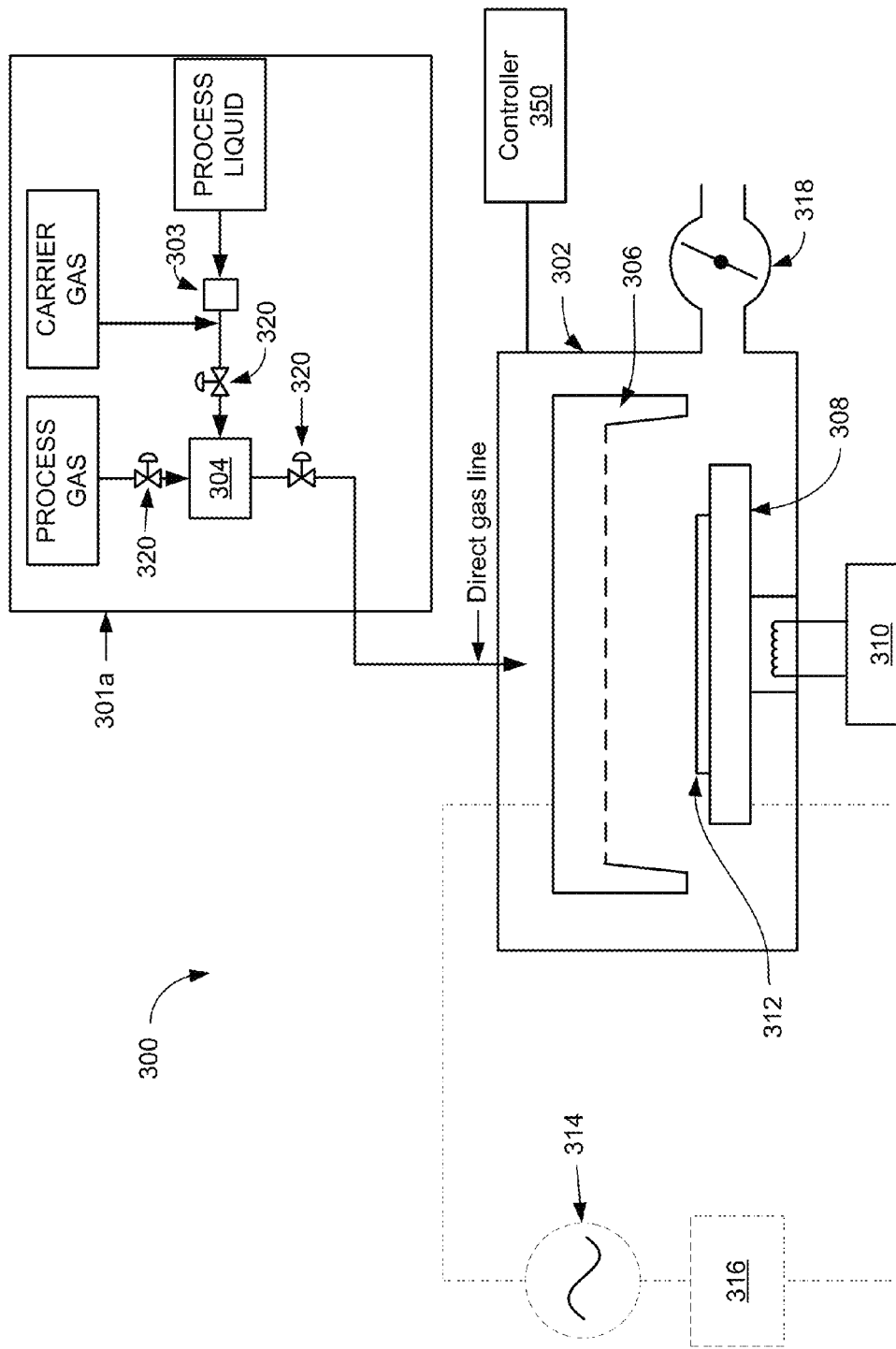
FIG. 3 is a schematic diagram of an example process station for performing disclosed embodiments.
Figure 4:
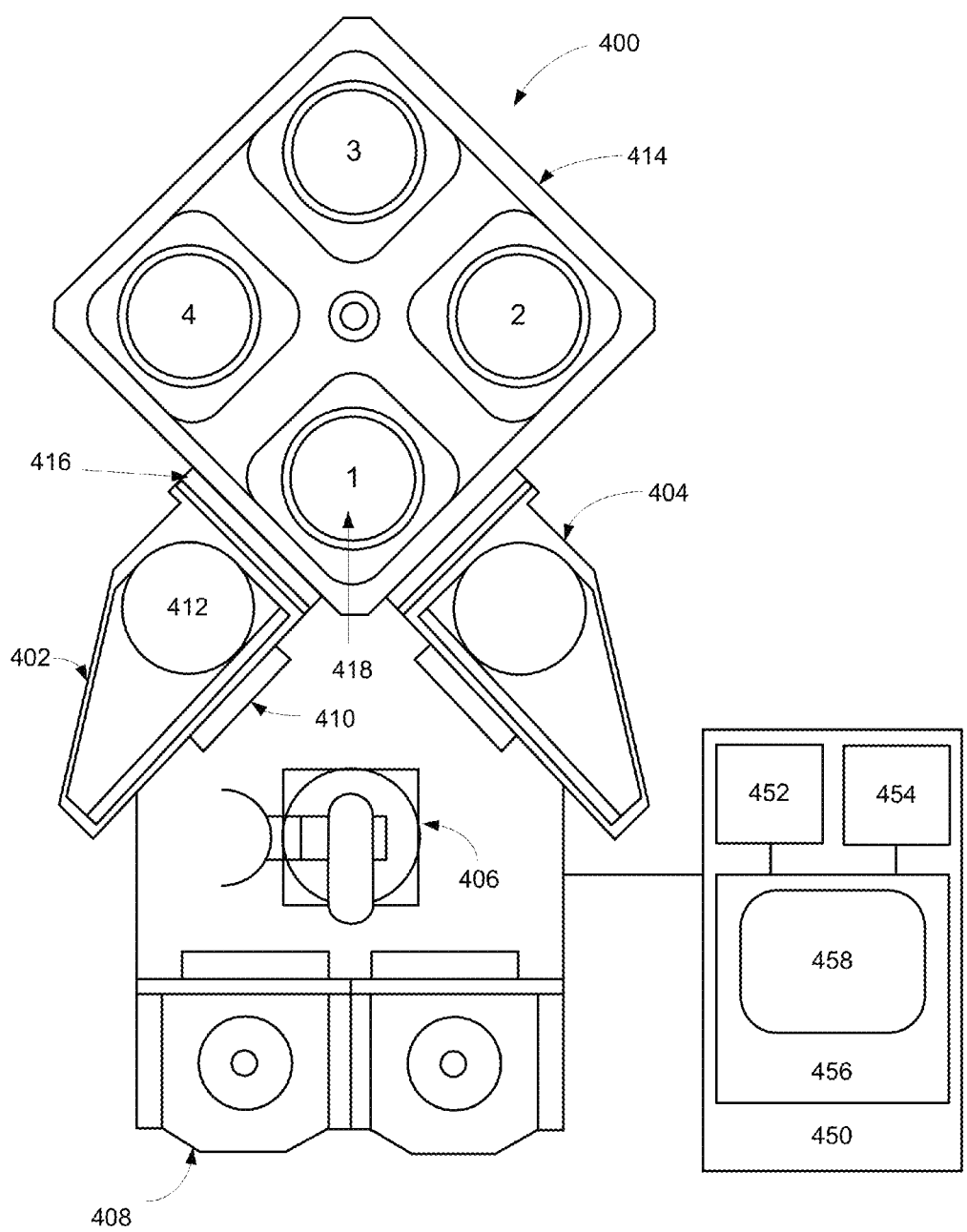
FIG. 4 is a schematic diagram of an example process tool for performing disclosed embodiments.

FIG. 3 depicts a schematic illustration of an embodiment of an atomic layer deposition (ALD) process station 300 having a process chamber body 302 for maintaining a low-pressure environment. A plurality of ALD process stations 300 may be included in a common low pressure process tool environment. For example, FIG. 4 depicts an embodiment of a multi-station processing tool 400. In some embodiments, one or more hardware parameters of ALD process station 300, including those discussed in detail below, may be adjusted programmatically by one or more computer controllers 350.

ALD process station 300 fluidly communicates with reactant delivery system 301a for delivering process gases to a distribution showerhead 306. Reactant delivery system 301a includes a mixing vessel 304 for blending and/or conditioning process gases for delivery to showerhead 306. One or more mixing vessel inlet valves 320 may control introduction of process gases to mixing vessel 304.

As an example, the embodiment of FIG. 3 includes a vaporization point 303 for vaporizing liquid reactant to be supplied to the mixing vessel 304. In some embodiments, vaporization point 303 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 303 may be heat traced. In some examples, mixing vessel 304 may also be heat traced. In one non-limiting example, piping downstream of vaporization point 303 has an increasing temperature profile extending from approximately 100° C. to approximately 150° C. at mixing vessel 304.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 303. In one scenario, a liquid injector may be mounted directly to mixing vessel 304. In another scenario, a liquid injector may be mounted directly to showerhead 306.

In some embodiments, a liquid flow controller (LFC) upstream of vaporization point 303 may be provided for controlling a mass flow of liquid for vaporization and delivery to process station 300. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 306 distributes process gases toward substrate 312. In the embodiment shown in FIG. 3, the substrate 312 is located beneath showerhead 306 and is shown resting on a pedestal 308. Showerhead 306 may have any suitable shape, and may have any suitable number and arrangement of ports for distributing process gases to substrate 312.

In some embodiments, a microvolume is located beneath showerhead 306. Practicing disclosed embodiments in a microvolume rather than in the entire volume of a process station may reduce reactant exposure and purge times, may reduce times for altering process conditions (e.g., pressure, temperature, etc.) may limit an exposure of process station robotics to process gases, etc. Example microvolume sizes include, but are not limited to, volumes between 0.1 liter and 2 liters. This also impacts productivity throughput. In some embodiments, the disclosed embodiments are not performed in a microvolume.

In some embodiments, pedestal 308 may be raised or lowered to expose substrate 312 to microvolume and/or to vary a volume of microvolume. For example, in a substrate transfer phase, pedestal 308 may be raised to position substrate 312 within microvolume. In some embodiments, microvolume may completely enclose substrate 312 as well as a portion of pedestal 308 to create a region of high flow impedance.

Optionally, pedestal 308 may be lowered and/or raised during portions of the process to modulate process pressure, reactant concentration, etc., within microvolume. In one scenario where process chamber body 302 remains at a base pressure during the process, lowering pedestal 308 may allow microvolume to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller 350.

In another scenario, adjusting a height of pedestal 308 may allow a plasma density to be varied during plasma activation cycles included in the process. At the conclusion of the process phase, pedestal 308 may be lowered during another substrate transfer phase to allow removal of substrate 312 from pedestal 308.

While the example microvolume variations described herein refer to a height-adjustable pedestal 308, it will be appreciated that, in some embodiments, a position of showerhead 306 may be adjusted relative to pedestal 308 to vary a volume of microvolume. Further, it will be appreciated that a vertical position of pedestal 308 and/or showerhead 306 may be varied by any suitable mechanism within the scope of the present disclosure. In some embodiments, pedestal 308 may include a rotational axis for rotating an orientation of substrate 312. It will be appreciated that, in some embodiments, one or more of these example adjustments may be performed programmatically by one or more suitable computer controllers 350.

In some embodiments where plasma may be used as discussed above, showerhead 306 and pedestal 308 electrically communicate with a radio frequency (RF) power supply 314 and matching network 316 for powering a plasma. In some embodiments, the plasma energy may be controlled by controlling one or more of a process station pressure, a gas concentration, an RF source power, an RF source frequency, and a plasma power pulse timing. For example, RF power supply 314 and matching network 316 may be operated at any suitable power to form a plasma having a desired composition of radical species. Examples of suitable powers are included above. Likewise, RF power supply 314 may provide RF power of any suitable frequency. In some embodiments, RF power supply 314 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 350 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as disilane), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for setting a flow rate of an inert and/or reactant gas which may be the same as or different from the gas used in the first recipe phase (e.g., the plasma reactant such as nitrogen), instructions for modulating a flow rate of a carrier gas, and time delay instructions for the third recipe phase. A fourth recipe phase may include instructions for modulating or stopping a flow rate of an inert and/or a reactant gas, instructions for modulating the flow rate of a carrier or purge gas, and time delay instructions for the fourth recipe phase. It will be appreciated that these recipe phases may be further subdivided and/or iterated in any suitable way within the scope of the present disclosure.

In some embodiments, pedestal 308 may be temperature controlled via heater 310. Further, in some embodiments, pressure control for process station 300 may be provided by butterfly valve 318. As shown in the embodiment of FIG. 3, butterfly valve 318 throttles a vacuum provided by a downstream vacuum pump (not shown). However, in some embodiments, pressure control of process station 300 may also be adjusted by varying a flow rate of one or more gases introduced to the process station 300.

As described above, one or more process stations may be included in a multi-station processing tool. FIG. 4 shows a schematic view of an embodiment of a multi-station processing tool 400 with an inbound load lock 402 and an outbound load lock 404, either or both of which may include a remote plasma source. A robot 406, at atmospheric pressure, is configured to move wafers from a cassette loaded through a pod 408 into inbound load lock 402 via an atmospheric port 410. A wafer is placed by the robot 406 on a pedestal 412 in the inbound load lock 402, the atmospheric port 410 is closed, and the load lock is pumped down. Where the inbound load lock 402 includes a remote plasma source, the wafer may be exposed to a remote plasma treatment in the load lock prior to being introduced into a processing chamber 414. Further, the wafer also may be heated in the inbound load lock 402 as well, for example, to remove moisture and adsorbed gases. Next, a chamber transport port 416 to processing chamber 414 is opened, and another robot (not shown) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

The depicted processing chamber 414 includes four process stations, numbered from 1 to 4 in the embodiment shown in FIG. 4. Each station has a heated pedestal (shown at 418 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 414 may include one or more matched pairs of ALD and plasma-enhanced ALD process stations. While the depicted processing chamber 414 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 4 depicts an embodiment of a wafer handling system 490 for transferring wafers within processing chamber 414. In some embodiments, wafer handling system 490 may transfer wafers between various process stations and/or between a process station and a load lock. It will be appreciated that any suitable wafer handling system may be employed. Non-limiting examples include wafer carousels and wafer handling robots. FIG. 4 also depicts an embodiment of a system controller 450 employed to control process conditions and hardware states of process tool 400. System controller 450 may include one or more memory devices 456, one or more mass storage devices 454, and one or more processors 452. Processor 452 may include a CPU or computer, analog and/or digital input/output connections, stepper motor controller boards, etc.

In some embodiments, system controller 450 controls all of the activities of process tool 400. System controller 450 executes system control software 458 stored in mass storage device 454, loaded into memory device 456, and executed on processor 452. Alternatively, the control logic may be hard coded in the controller 450. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 458 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 400. System control software 458 may be configured in any suitable way. For example, various process tool component subroutines or control objects may be written to control operation of the process tool components used to carry out various process tool processes. System control software 458 may be coded in any suitable computer readable programming language.

In some embodiments, system control software 458 may include input/output control (IOC) sequencing instructions for controlling the various parameters described above. Other computer software and/or programs stored on mass storage device 454 and/or memory device 456 associated with system controller 450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 418 and to control the spacing between the substrate and other parts of process tool 400.

A process gas control program may include code for controlling gas composition (e.g., TMA, ammonia, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 450. The user interface may include a display screen, graphical software displays of the apparatus and/or process conditions, and user input devices such as pointing devices, keyboards, touch screens, microphones, etc.

In some embodiments, parameters adjusted by system controller 450 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 450 from various process tool sensors. The signals for controlling the process may be output on the analog and digital output connections of process tool 400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 450 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 450 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 450.

In some implementations, the system controller 450 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 450, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 450 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 450 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 450, in some implementations, may be a part of or coupled to a computer that is integrated with, coupled to the system, otherwise networked to the system, or a combination thereof. For example, the system controller 450 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 450 receives instructions in the form of data, which specify parameters for each of the processing steps to be performed during one or more operations. It should be understood that the parameters may be specific to the type of process to be performed and the type of tool that the system controller 450 is configured to interface with or control. Thus as described above, the system controller 450 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 450 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

Experiments were conducted to test deposition of silicon nitride using disilane and an ammonia plasma. Experiments were conducted at 250° C. and a pressure of 2 Torr. Each cycle included a 0.25 L dose of disilane, purge, exposure to 1L of ammonia with plasma for 2.5 seconds at varying powers, and another purge. In one trial, 500 cycles were performed; 200 cycles were performed in the other trials. Nonuniformity and refractive index were measured for each trial. The results are shown in Table 1 below.

TABLE 1

Silicon Nitride Deposition using Disilane and Ammonia Plasma

|  | Trial 1 | Trial 2 | Trial 3 | Trial 4 | Trial 5 | Trial 6 |
| --- | --- | --- | --- | --- | --- | --- |
| Power (W) | 200 | 200 | 400 | 600 | 1000 | 1000 |
| Cycles | 200 | 200 | 200 | 200 | 200 | 500 |
| Avg Thickness (Å) | 24 | 24 | 37 | 38 | 46 | 43 |
| Range Thickness (Å) | 12 | 12 | 38 | 8 | 27 | 15 |
| NU (% 1s) | 5.6379 | 6.6751 | 30.8954 | 3.0193 | 10.146 | 5.5156 |

TABLE 1-continued

Silicon Nitride Deposition using Disilane and Ammonia Plasma

|  | Trial 1 | Trial 2 | Trial 3 | Trial 4 | Trial 5 | Trial 6 |
|---|---|---|---|---|---|---|
| RI | 2.1053 | 2.0769 | 1.8397 | 1.7683 | 1.7577 | 1.8342 |
| RI NU (% 1s) | 11.0532 | 8.8029 | 22.3947 | 14.8023 | 9.2469 | 8.8487 |
| Dep Rate (Å/cyc) | 0.12 | 0.12 | 0.18 | 0.19 | 0.23 | 0.09 |

Increasing the number of cycles and increasing the power (Trial 6) showed little change in average thickness, which suggests the initial 43 Å of film is due to silicon surface nitridation, rather than film growth. Thus, as shown in Table 1, there is little to no silicon nitride growth on the surface of the substrate, and the deposition is very low, while the thickness shown may be due to silicon surface nitridation. This experiment suggests that disilane and ammonia plasma alone are insufficient to deposit silicon nitride films.

Experiment 2

An experiment was conducted to compare a silicon nitride film deposited using disclosed embodiments versus using a conventional aminosilane precursor. First, a silicon nitride film was deposited using atomic layer deposition (ALD). Bis(diethyl)aminosilane was introduced using an argon carrier gas to the station or chamber where the substrate was housed. The station was then purged. A nitrogen plasma was ignited at a frequency of 27 MHz and a power of 300 W for 2.5 seconds. The station was purged again. The deposited film deposited at about 0.46 Å of SiN per cycle.

Next, a silicon nitride film was deposited using ALD on another substrate using the method described above in FIG. 1. Disilane was introduced using an argon carrier gas to a station where this second substrate was housed. The station was then purged. A nitrogen plasma was ignited at a frequency of 27 MHz and a power of 300 W for 2.5 seconds. The station was purged again. The film deposition rate was about 0.55 Å per cycle. Both substrates were evaluated by x-ray photoelectron spectroscopy. The film deposited using aminosilane had 12% carbon. The film deposited using disilane had 0% carbon.

Figure 5:
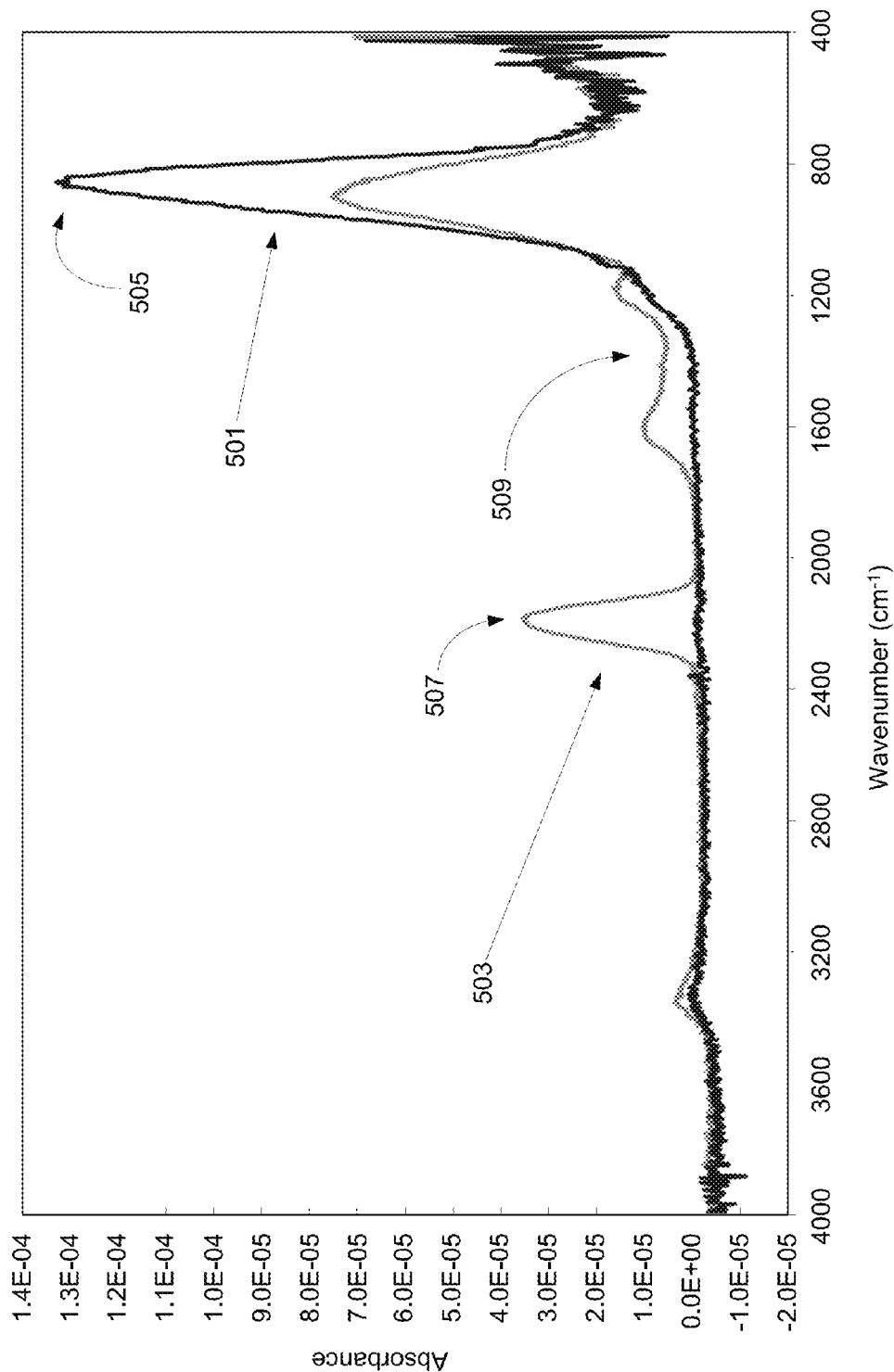
FIG. 5 is a Fourier transform infrared spectrum of films from experimental data.

Fourier transform spectroscopy was used to compare compositions of the two films. FIG. 5 shows the FTIR spectrum. Curve 503 represents the film deposited using the aminosilane precursor, which shows a Si—H peak at 507, and some carbon peaks at 509. Curve 501 represents the film deposited using the disilane precursor, which shows a strong peak 505 for the Si—N bond. Note that curve 503 has a smaller peak for the Si—N bond, and that curve 501 has no corresponding peak for Si—H. These results suggest that using the disilane precursor results in a film with more Si—N bonds and cross-linking, essentially no carbon contamination, and little hydrogen incorporation.

Data for the above described films are represented below in Table 2 as Film 1 (aminosilane precursor) and Film 3 (disilane precursor). Additional films were deposited at varying frequencies and powers. In particular, the bis(diethyl)aminosilane precursor was used to deposit an SiN film at a frequency of 13.56 MHz and a power of 300 W, the results of which are depicted in Film 2 of Table 2 below. Disilane was used as a precursor for deposition at 300 W and 13.56 MHz, as well as 200 W and 13.56 MHz. For each of these films, the deposition rate, uniformity, RI, peak height of Si—H (which represents incorporation of hydrogen), peak height of Si—N (which represents presence of Si—N bonds), and step coverage were evaluated. For some films, some properties were not measured and are represented with the label "N/D" for no data. Overall, step coverage was similar between films deposited by bis(diethyl)aminosilane (28%, 33%) and disilane (27%). The films deposited using disilane had improved RI and better film quality (less Si—H, more Si—N, more uniform).

TABLE 2

Silicon Nitride Films Deposited by Bis(diethyl)aminosilane and Disilane

| Film # | 1 | 2 | 3 | 4 | 5 |
|---|---|---|---|---|---|
| Precursor | bis(diethyl)-aminosilane | | disilane | | |
| Power (W) | 300 | | 300 | 200 | |
| Frequency (MHz) | 27 | 13.56 | 27 | 13.56 | 13.56 |
| Deposition Rate (Å/cyc) | 0.44 | 0.5 | 0.55 | 0.60 | 0.55 |
| Uniformity (1σ %) | 3.5% | 2.5% | 1.0% | 1.0% | 1.4% |
| Refractive Index | 1.89 | 1.83 | 1.98 | 1.89 | 1.95 |
| Peak Height Si—H | 3.4E−05 | 2.7E−05 | 0 | N/D | N/D |
| Peak Height Si—N | 7.4E−05 | 6.6E−05 | 1.3E−04 | N/D | N/D |
| Step Coverage | 28% | 33% | N/D | 27% | N/D |

Experiment 3

An experiment was conducted to compare films deposited by ammonia plasma versus nitrogen plasma. The first film was deposited at 400° C. using trisilylamine as the silicon precursor and ammonia plasma at an RF frequency of 13.56 MHz. The second film was deposited at 400° C. using trisilylamine as the silicon precursor and nitrogen plasma at an RF frequency of 13.56 MHz in accordance with the method described above in FIG. 1. The third film was deposited at 250° C. using trisilylamine as the silicon precursor and ammonia plasma at an RF frequency of 13.56 MHz. The fourth film was deposited at 250° C. using trisilylamine as the silicon precursor and nitrogen plasma at an RF frequency of 13.56 MHz in accordance with the method described above in FIG. 1. The deposition rates and RI values were evaluated for all films, and step coverage for the two nitrogen plasma films was also measured. The results are summarized in Table 3.

As shown, higher temperature resulted in higher step coverage, as Film 7 has 60% step coverage, while Film 9 deposited at 250° C. has 30% step coverage. Moreover, the presence of hydrogen in the plasma suppressed deposition. At 400° C., Film 6 had a lower deposition rate than Film 7, which was deposited using nitrogen plasma. The same pattern is shown for Films 8 and 9, with Film 9 having a higher deposition rate when a nitrogen plasma is used. These results suggest using nitrogen plasma as opposed to ammonia plasma increases deposition of the silicon nitride film.

TABLE 3

Ammonia Plasma vs. Nitrogen Plasma

| Film # | 6 | 7 | 8 | 9 |
|---|---|---|---|---|
| Precursor | trisilylamine | | trisilylamine | |
| Frequency (MHz) | 13.56 | | 13.56 | |
| Temperature (° C.) | 400 | 400 | 250 | 250 |
| Plasma Reactant | Ammonia (NH$_3$) | Nitrogen (N$_2$) | Ammonia (NH$_3$) | Nitrogen (N$_2$) |
| Deposition Rate (Å/cyc) | 0.21 | 0.45 | 0.06 | 0.27 |
| Refractive Index | 1.89 | 1.93 | 1.88 | 1.93 |
| Step Coverage | N/D | 60% | N/D | 30% |

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of depositing a silicon nitride film on a substrate surface in a chamber, the method comprising:
   (a) exposing the substrate surface to a silicon-containing precursor under conditions allowing formation of an adsorbed layer of the silicon-containing precursor on the substrate surface, and
   (b) exposing the adsorbed layer to a nitrogen (N$_2$) plasma to thereby form a silicon nitride film,
   wherein the silicon-containing precursor is N—H bond-free, halogen-free, and carbon-free, and
   wherein the silicon nitride film has a composition such that an FTIR spectrum of the silicon nitride film does not show a Si—H peak.

2. The method of claim 1, wherein the method is performed at a temperature of less than about 250° C.

3. The method of claim 1, wherein the silicon-containing precursor is selected from the group consisting of silane, disilane, trisilane, tetrasilane, and trisilylamine.

4. The method of claim 1, further comprising:
   (c) repeating (a)-(b), and
   (d) periodically exposing the substrate surface to a hydrogen-containing plasma.

5. The method of claim 4, wherein (d) comprises pulsing the hydrogen-containing plasma for a pulse duration of between about 0.05 seconds and about 60 seconds.

6. The method of claim 4, wherein exposing the substrate surface to the hydrogen-containing plasma comprises exposing the substrate surface to a hydrogen-containing gas and igniting a plasma, wherein the hydrogen-containing gas is selected from the group consisting of ammonia, hydrogen, and combinations thereof.

7. The method of claim 1, wherein a carrier gas is flowed throughout (a) through (b).

8. The method of claim 7, wherein the carrier gas is hydrogen-free.

9. The method of claim 1, wherein the plasma is an RF plasma generated at a frequency of at least about 13.56 MHz.

10. The method of claim 9, wherein the plasma is plasma generated at a frequency of about 27 MHz.

11. The method of claim 1, wherein the silicon-containing precursor is adsorbed onto less than about 60% of the substrate surface.

12. The method of claim 1, wherein the adsorbed layer on the substrate surface in (a) is less than about 0.5 Å thick.

13. The method of claim 1, wherein the silicon-containing precursor has a silicon to hydrogen ratio between about 12:4 and about 12:5.

14. A method of depositing a silicon nitride film on a substrate surface in a chamber, the method comprising:
   (a) exposing the substrate surface to a silicon-containing precursor under conditions allowing formation of an adsorbed layer of the silicon-containing precursor on the substrate surface, and
   (b) exposing the adsorbed layer to a nitrogen (N$_2$) plasma to thereby form a silicon nitride film,
   wherein the silicon-containing precursor comprises at least about 75% nonpolar covalent bonds,
   wherein the silicon-containing precursor is halogen-free and carbon-free, and
   wherein the silicon nitride film has a composition such that an FTIR spectrum of the silicon nitride film does not show a Si—H peak.

15. The method of claim 14, wherein the silicon-containing precursor is trisilylamine.

16. The method of claim 14, further comprising:
   (c) repeating (a)-(b), and
   (d) periodically exposing the substrate surface to a hydrogen-containing plasma.

17. The method of claim 16, wherein (d) comprises pulsing the hydrogen-containing plasma for a pulse duration of between about 0.05 seconds and about 60 seconds.

18. The method of claim 16, exposing the substrate surface to the hydrogen-containing plasma comprises exposing the substrate surface to a hydrogen-containing gas and igniting a plasma, wherein the hydrogen-containing gas is selected from the group consisting of ammonia, hydrogen, and combinations thereof.

19. The method of claim 14, wherein the adsorbed layer on the substrate surface in (a) is less than about 0.5 Å thick.

20. A method of depositing a silicon nitride film on a substrate surface in a chamber, the method comprising:
   (a) exposing the substrate surface to a silicon-containing precursor under conditions allowing formation of an adsorbed layer of the silicon-containing precursor on the substrate surface;
   (b) exposing the adsorbed layer to a nitrogen (N$_2$) plasma to thereby form a silicon nitride film, wherein the silicon-containing precursor is N—H bond-free and halogen-free;
   (c) repeating (a)-(b); and
   (d) periodically exposing the substrate surface to a hydrogen-containing plasma,
   wherein the silicon nitride film has a composition such that an FTIR spectrum of the silicon nitride film does not show a Si—H peak.

21. The method of claim 14, wherein the silicon-containing precursor is disilane.

* * * * *